United States Patent
Cheng et al.

(10) Patent No.: US 12,317,762 B2
(45) Date of Patent: May 27, 2025

(54) VERTICAL PHASE CHANGE MEMORY DEVICE

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Carl Radens, LaGrangeville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 17/820,578

(22) Filed: Aug. 18, 2022

(65) Prior Publication Data

US 2024/0065119 A1  Feb. 22, 2024

(51) Int. Cl.
*H10N 70/00* (2023.01)
*H10B 63/00* (2023.01)
*H10N 70/20* (2023.01)

(52) U.S. Cl.
CPC ........... *H10N 70/826* (2023.02); *H10B 63/24* (2023.02); *H10B 63/82* (2023.02); *H10N 70/063* (2023.02); *H10N 70/231* (2023.02); *H10N 70/841* (2023.02)

(58) Field of Classification Search
CPC .. H10N 70/826; H10N 70/231; H10N 70/841; H10N 70/063; H10B 63/24; H10B 63/82
See application file for complete search history.

(56) References Cited

U.S. PATENT DOCUMENTS

| | | | |
|---|---|---|---|
| 7,670,871 B2 | 3/2010 | Chen |
| 7,745,811 B2 | 6/2010 | Lee |
| 8,779,408 B2 | 7/2014 | Lee |
| 9,246,093 B2 | 1/2016 | Zanderighi |
| 10,763,307 B1 | 9/2020 | Carta |
| 2008/0035961 A1 | 2/2008 | Chen |

(Continued)

FOREIGN PATENT DOCUMENTS

CN    102934229 A    2/2013

OTHER PUBLICATIONS

Notification of Transmittal of the International Search Report and the Written Opinion of the International Searching Authority, or the Declaration, Date of mailing Nov. 6, 2023, Applicant's or agent's file reference PF230198PCT, International application No. PCT/CN2023/113050, 9 pages.

(Continued)

*Primary Examiner* — Bo B Jang
(74) *Attorney, Agent, or Firm* — Yuanmin Cai

(57) ABSTRACT

Embodiments of present invention provide a phase change memory (PCM) device. The PCM device includes a first PCM cell with the first PCM cell including an L-shaped phase change element, the L-shaped phase change element having a horizontal portion and a vertical portion on top of the horizontal portion; a selector underneath the horizontal portion of the L-shaped phase change element; a top electrode in contact with a top surface of the vertical portion of the L-shaped phase change element; and a bottom electrode in contact with the selector; and a second PCM cell. A method of manufacturing the PCM device is also provided.

17 Claims, 9 Drawing Sheets

(56) References Cited

U.S. PATENT DOCUMENTS

| | | |
|---|---|---|
| 2011/0291064 A1 | 12/2011 | Marsh |
| 2013/0058152 A1 | 3/2013 | Pellizer |
| 2013/0058158 A1 | 3/2013 | Pellizer |
| 2017/0092694 A1* | 3/2017 | BrightSky .......... G11C 13/0069 |
| 2020/0152870 A1* | 5/2020 | Lin .................... H10N 70/8828 |
| 2020/0395537 A1* | 12/2020 | Ok ...................... H10N 70/861 |

OTHER PUBLICATIONS

Wang et al., "Proposing novel "L" shaped fin to boost the melting performance of a vertical PCM enclosure", Case Studies in Thermal Engineering 28 (2021) 101465, 15 pages.

Zhang et al., "Investigation on effect of connection angle of "L" shaped fin on charging and discharging process of PCM in vertical enclosure", Case Studies in Thermal Engineering 33 (2022) 101908, 15 pages.

\* cited by examiner

VERTICAL PHASE CHANGE MEMORY DEVICE

BACKGROUND

The present application relates to manufacturing of semiconductor integrated circuits. More particularly, it relates to a cross-point phase change memory device and method of manufacturing the same.

Phase change memory has recently emerged as a viable technology for memory application and analog computing. In a typical phase change memory (PCM) device such as, for example, a cross-point PCM device, each memory cell includes a storage element and a selector. The storage element is a PCM cell, and the selector is typically an ovonic threshold switch (OTS). The vertically integrated PCM device of one PCM cell and one OTS (PCMS) may be embedded in a cross-point array. Arrays of the PCM devices may be stacked on top of CMOS circuits for decoding, sensing, and/or other logic functions.

Ideally it is desirable to operate at a relatively high current density in the PCM cell such that the PCM cell may be programmed through melting, quenching, and/or recrystallization. In the meantime, it is desirable to operate at a relatively low current density in the OTS such that the OTS does not suffer from thermal effect and therefore may be able to remain in amorphous state. This is because excessive current density through the OTS may result in poor endurance of the OTS and/or undesired phase change in the OTS. Unfortunately, in currently existing cross-point PCM devices, the OTS and PCM cell are generally made through forming a stack of relevant material layers and patterning the stack together, resulting in a PCM device that has substantially the same working areas of the OTS and PCM cell. When such a PCM device is programed, the OTS and PCM cell are generally subjected to a same current density instead of different current densities that are tailored individually for the OTS and the PCM cell.

SUMMARY

Embodiments of present invention provide a phase change memory (PCM) device. The PCM device includes a first PCM cell and the first PCM cell includes an L-shaped phase change element, the L-shaped phase change element having a horizontal portion and a vertical portion on top of the horizontal portion; a selector underneath the horizontal portion of the L-shaped phase change element; a top electrode in contact with a top surface of the vertical portion of the L-shaped phase change element; and a bottom electrode in contact with the selector. The PCM device further includes a second PCM cell. By the above structure, the selector underneath the horizontal portion of the L-shaped phase change element has a horizontal cross-sectional area that is much smaller than that of the vertical portion of the phase change element, resulting in a much lower current density than that in the vertical portion of the phase change element. The selector is able to avoid possible thermal damage during operation.

In one embodiment, the first PCM cell further includes a sidewall spacer directly adjacent to the vertical portion of the L-shaped phase change element and on top of a portion of the horizontal portion of the L-shaped phase change element.

In another embodiment, the first PCM cell further includes, optionally, an L-shaped resistive liner, the L-shaped resistive liner conformally lining a sidewall and a bottom surface of the L-shaped phase change element. The resistive liner mitigates likely resistance/conductance drift of the phase change element when the material of phase change element is in an amorphous state after a RESET operation.

In yet another embodiment, the first PCM cell further includes, optionally, an interfacial layer between a horizontal portion of the L-shaped resistive liner and the selector. This interfacial layer helps stability of device performance by improving adhesiveness between the selector and the resistive liner and/or the phase change element.

According to one embodiment, the second PCM cell includes an L-shaped phase change element having a vertical portion and a horizontal portion and a sidewall spacer directly adjacent to the vertical portion of the L-shaped phase change element of the second PCM cell, and wherein the vertical portions of the L-shaped phase change elements of the first and second PCM cells are separated by at least the sidewall spacers of the first and second PCM cells.

In one embodiment, the second PCM cell share the top electrode with the first PCM cell, and the top electrode is placed orthogonal to the bottom electrode.

In another embodiment, wherein the vertical portion of the L-shaped phase change element of the first PCM cell has a horizontal cross-sectional area that is smaller than a surface area of the selector that faces the horizontal portion of the L-shaped phase change element of the first PCM cell.

Embodiments of present invention provide a method of forming PCM devices. The method includes forming a bottom electrode layer on a supporting structure; forming a selector layer on top of the bottom electrode layer; forming a trench above the selector layer, the trench being surrounded by an interlevel dielectric layer to have a sidewall; depositing a resistive layer and a phase change material layer inside the trench and against the sidewall of the trench; forming a sidewall spacer covering a vertical portion of the phase change material layer; patterning the phase change material layer into an L-shaped phase change element, the L-shaped phase change element having a horizontal portion and a vertical portion on top of the horizontal portion; and forming a top electrode in contact with the vertical portion of the L-shaped phase change element.

In one embodiment, patterning the phase change material layer further includes patterning the resistive layer into an L-shaped resistive liner, the resistive liner conformally lining a sidewall and a bottom surface of the L-shaped phase change element.

In another embodiment, patterning the phase change material layer further includes patterning the selector layer into a selector and patterning the bottom electrode layer into a bottom electrode.

In yet another embodiment, forming the top electrode includes forming the top electrode to be orthogonal with the bottom electrode.

According to one embodiment, the method further includes forming an interfacial layer above the selector layer before forming the trench.

In one embodiment, forming the trench includes removing a hard mask from a top of the interfacial layer, wherein the hard mask is surrounded by the interlevel-dielectric layer and is used in an etching process in forming the selector layer and the bottom electrode layer.

BRIEF DESCRIPTION OF THE DRAWINGS

The present invention will be understood and appreciated more fully from the following detailed description of embodiments of present invention, taken in conjunction with accompanying drawings of which.

Figure 1:
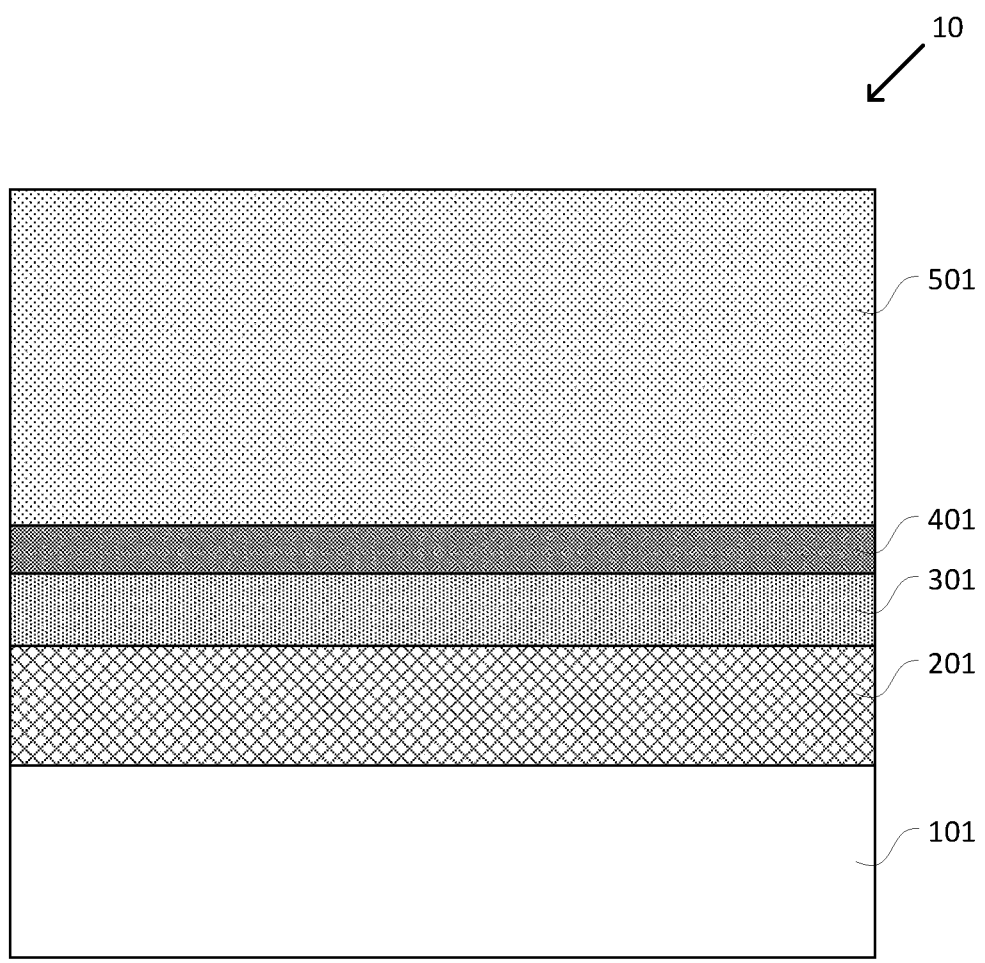
FIG. 1 is a demonstrative illustration of cross-sectional view of a PCM device in a step of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a PCM device in a step of manufacturing thereof according to one embodiment of present invention. More particularly, in manufacturing a PCM device 10 (also see FIG. 8), embodiments of present invention provide receiving a supporting structure 101 such as, for example, a semiconductor substrate thereupon there may be formed other active or passive semiconductor devices such as, for example, transistors, isolation structures, and/or contacts (not shown). Embodiments of present invention further provide forming a blanket bottom electrode layer 201 on top of the supporting structure 101 through, for example, a chemical-vapor-deposition (CVD) process. The blanket bottom electrode layer 201 may be, for example, a layer of titanium nitride and may be formed to have a thickness ranging from about 50 nm to about 100 nm, although the blanket bottom electrode layer 201 may be of other suitable materials and thicknesses, depending upon specific applications of the PCM device 10. For example, the blanket bottom electrode layer 201 may be implemented using one or more layers of materials such as, for example, tungsten (W), aluminum (Al), copper (Cu), titanium nitride (TiN), tantalum nitride (TaN), tungsten nitride (WN), doped polysilicon, cobalt silicide (CoSi), tungsten silicide (WSi) and other materials. In one embodiment, the blanket bottom electrode layer 201 may be formed on a metal level or as part of a metal level such as, for example, M2, M3, etc. in a back-end-of-line (BEOL) structure. In this case, the metal level such as M2 or M3 may sometimes be referred to as part of the PCM device 10.

Embodiments of present invention further provide forming a blanket selector layer 301 on top of the blanket bottom electrode layer 201 and a blanket interfacial layer 401 on top of the blanket selector layer 301 through, for example, a deposition process. The blanket selector layer 301 may include a chalcogenide combination selected for operation as an ovonic threshold switch and may include one or more elements selected from the group that includes arsenic (As), tellurium (Te), antimony (Sb), selenium (Se), germanium (Ge), silicon (Si), oxygen (O) and nitrogen (N). In one example, the blanket selector layer 301 may be formed to have a thickness ranging from about 10 nm to about 50 nm, preferably about 30 nm. In other embodiments, other types of selector device such as diodes, transistors, etc. associated with each PCM cell may be utilized.

On the other hand, the blanket interfacial layer 401 may be deposited on top of the blanket selector layer 301. The blanket interfacial layer 401 may include a material or a combination of materials that are selected to provide adequate adhesion, in some embodiment, between the blanket selector layer 301 and the (later formed) phase change material layer 602 and/or the (later formed) resistive layer 601 (see FIG. 5). This blanket interfacial layer 401 helps stability of device performance by improving adhesiveness between the blanket selector layer 301 and the (later formed) resistive layer 601 and/or phase change material layer 602 (see FIG. 5). The blanket interfacial layer 401 may also act as a diffusion barrier that helps block movement of impurities from the phase change material layer 602 into the blanket selector layer 301 and vice versa. The blanket interfacial layer 401 may include conductive material and may be formed to have a thickness ranging from about 3 nm to about 50 nm, preferably about 5 nm. Suitable materials for the blanket interfacial layer 401 may include metal nitrides such as, for example, tungsten nitride (WN), tantalum nitride (TaN), molybdenum nitride (MoN), titanium silicon nitride (TiSiN), and titanium aluminum nitride (TiAlN). In addition to metal nitrides, other conductive materials such as, for example, titanium carbide (TiC), tungsten carbide (WC), molybdenum (Mo), tantalum (Ta), titanium silicide (TiSi), tantalum silicide (TaSi), and titanium tungsten (TiW) may be used as well in forming the blanket interfacial layer 401.

The blanket bottom electrode layer 201, the blanket selector layer 301, and the blanket interfacial layer 401 may later be subject to a lithographic patterning and etching process, as being described below in more details. As part of this patterning process, embodiments of present invention provide forming a blanket hard mask layer 501 on top of the blanket selector layer 301, and more specifically on top of the blanket interfacial layer 401, through for example a deposition process. In one embodiment, the blanket hard mask layer 501 may be formed to have a thickness ranging from about 50 nm to about 250 nm.

Figure 2:
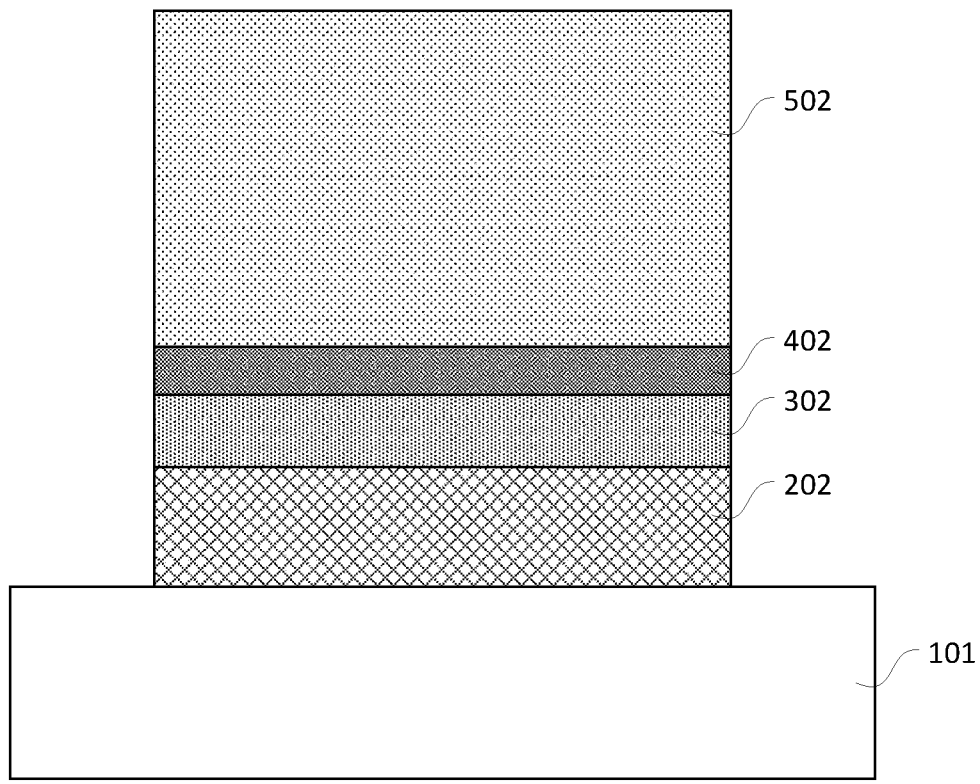
FIG. 2 is a demonstrative illustration of cross-sectional view of a PCM device in a step of manufacturing thereof, following the step illustrated in FIG. 1, according to one embodiment of present invention.

FIG. 2 is a demonstrative illustration of cross-sectional view of a PCM device in a step of manufacturing thereof, following the step illustrated in FIG. 1, according to one embodiment of present invention. More particularly, embodiments of present invention provide forming a hard mask 502 from the blanket hard mask layer 501 through, for example, a lithographic patterning process. The hard mask 502 may subsequently be used as an etch mask in one or more etching processes such as, for example, a reactive-ion-etching (RIE) process in patterning the stack of layers underneath thereof. For example, using the RIE process, embodiments of present invention provide etching the blanket bottom electrode layer 201, the blanket selector layer 301, and the blanket interfacial layer 401 into a bottom electrode layer 202, a selector layer 302, and an interfacial layer 402 respectively.

Figure 3:
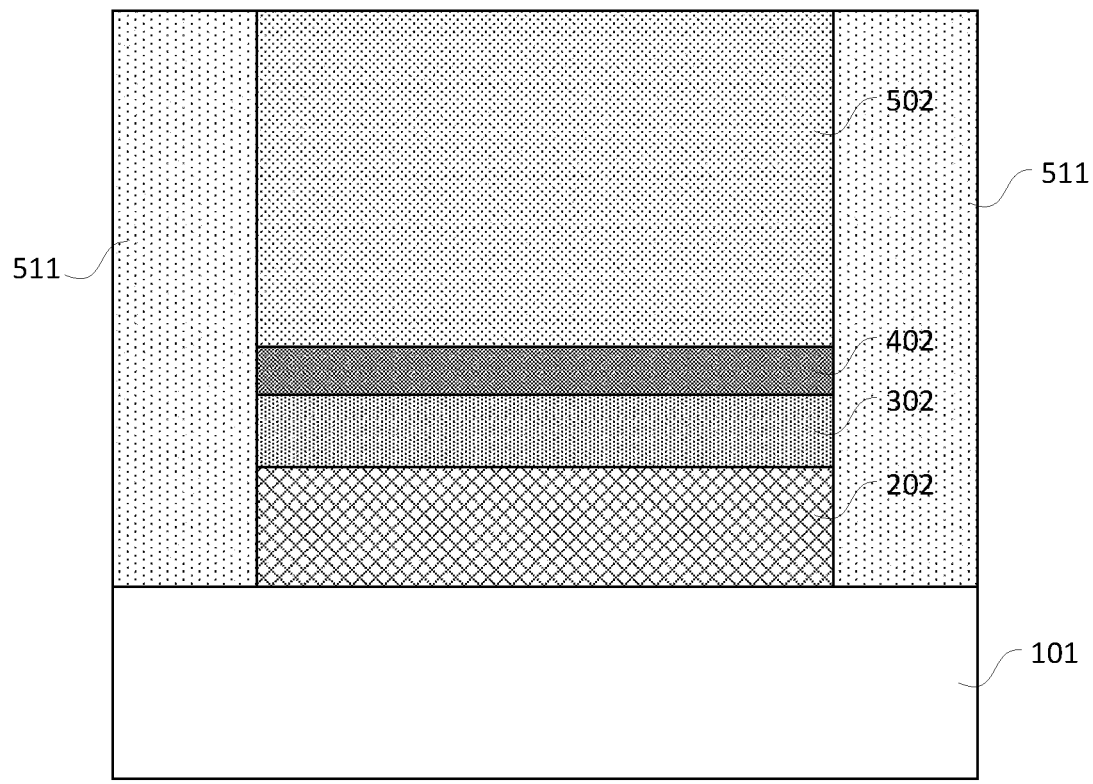
FIG. 3 is a demonstrative illustration of cross-sectional view of a PCM device in a step of manufacturing thereof, following the step illustrated in FIG. 2, according to one embodiment of present invention.

FIG. 3 is a demonstrative illustration of cross-sectional view of a PCM device in a step of manufacturing thereof, following the step illustrated in FIG. 2, according to one embodiment of present invention. More particularly, embodiments of present invention provide forming a trench above the selector layer 302 and the interfacial layer 402 to be surrounded by an interlevel-dielectric (ILD) layer. In order to do so, embodiments of present invention provide depositing an ILD layer 511 on top of and surrounding the stack of layers that includes the bottom electrode layer 202, the selector layer 302, the interfacial layer 402, and the hard mask 502. The ILD layer 511 may be made of silicon dioxide, undoped silica glass (USG), fluorosilicate glass (FSG), a flowable oxide (FOX) layer, borophosphosilicate glass (BPSG), a spin-on low-k dielectric layer, a chemical vapor deposition (CVD) deposited low-k dielectric layer, or any combination thereof. It is noted here that the term "low-k" denotes a dielectric material that has a dielectric constant of less than silicon dioxide.

Although not explicitly shown in FIG. 3, the ILD layer 511 may include a multi-layered structure that includes at least two different dielectric materials stacked one on top of the other such as, for example, silicon nitride (SiN) and silicon oxide (SiO). In one embodiment, the ILD layer 511 may be formed by utilizing a deposition process such as, for example, a CVD process, a plasma-enhanced CVD (PECVD) process, or a physical-vapor-deposition (PVD) process, or by using evaporating, spin-on coating, and/or other suitable means to have a height higher than a top surface of the hard mask 502. Subsequently, excessive dielectric material of the ILD layer 511 above the top of the hard mask 502 may be removed through applying, for example, a chemical-mechanic-polishing (CMP) process. The CMP process may expose the top surface of the hard mask 502.

Figure 4:
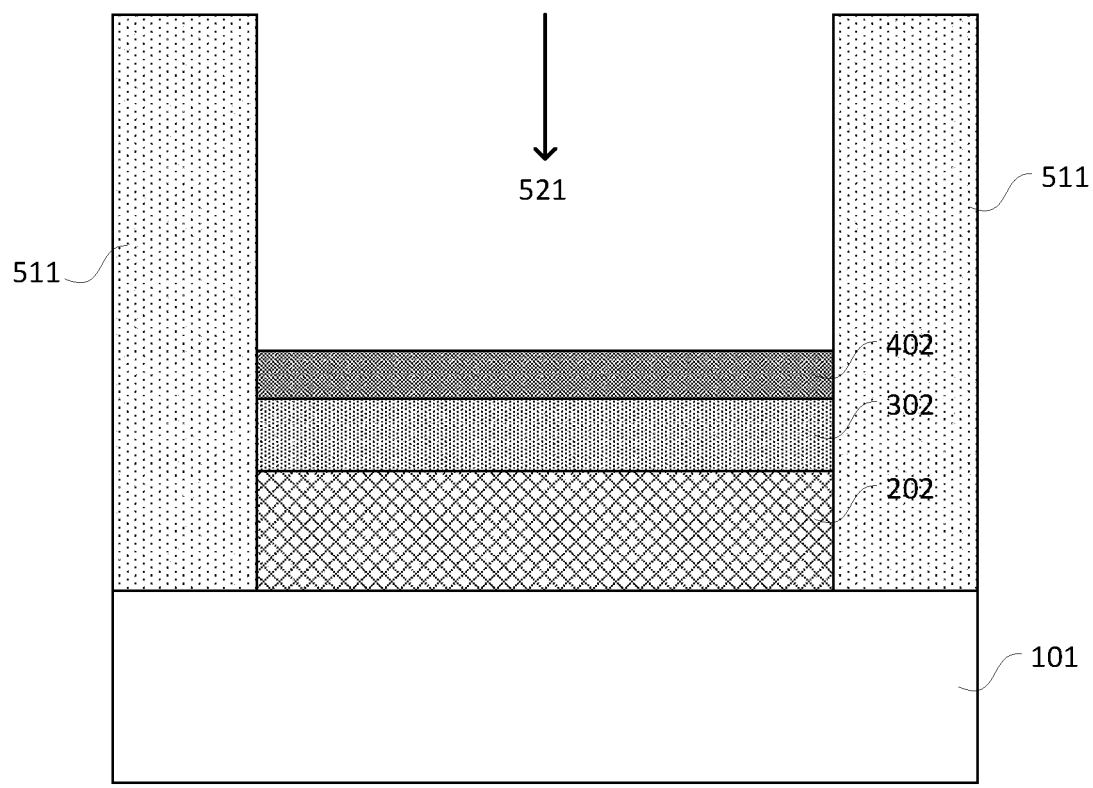
FIG. 4 is a demonstrative illustration of cross-sectional view of a PCM device in a step of manufacturing thereof, following the step illustrated in FIG. 3, according to one embodiment of present invention.

FIG. 4 is a demonstrative illustration of cross-sectional view of a PCM device in a step of manufacturing thereof, following the step illustrated in FIG. 3, according to one embodiment of present invention. More particularly, embodiments of present invention provide, after exposing the top surface of the hard mask 502 through a CMP process, removing the hard mask 502. The removal of the hard mask 502 may be made through, for example, a dry etching process such as a RIE process or a wet etching process such as by using solvent. The removal of the hard mask 502 creates a trench 521 that self-aligns with the below stack of material layers, i.e., the stack of the interfacial layer 402, the selector layer 302, and the bottom electrode layer 202. The trench 521 may expose a top surface of the interfacial layer 402 underneath the hard mask 502 that is now removed. The interfacial layer 402 may be surrounded by the ILD layer 511. The trench 521 may have a depth ranging, but not limited to, from about 50 nm to about 250 nm.

Figure 5:
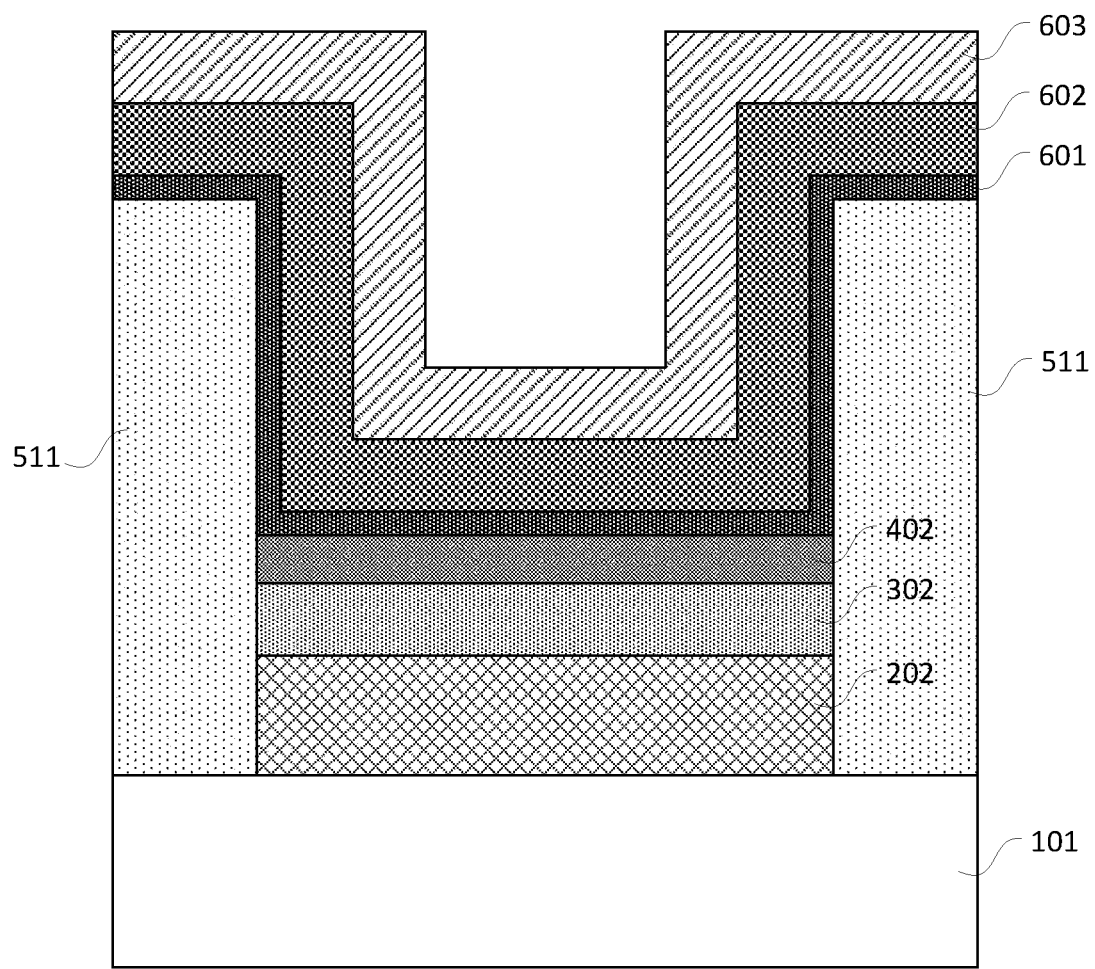
FIG. 5 is a demonstrative illustration of cross-sectional view of a PCM device in a step of manufacturing thereof, following the step illustrated in FIG. 4, according to one embodiment of present invention.

FIG. 5 is a demonstrative illustration of cross-sectional view of a PCM device in a step of manufacturing thereof, following the step illustrated in FIG. 4, according to one embodiment of present invention. More particularly, embodiments of present invention provide forming, such as through a CVD, a PVD, or an atomic-layer-deposition (ALD) process, a resistive layer 601 which may be optional, a phase change material layer 602 and a dielectric layer 603 on top of the ILD layer 511 and on top of the exposed top surface of the interfacial layer 402 in the trench 521. For example, embodiments of present invention may provide forming the optional resistive layer 601, which may be formed as a thin layer of resistivity material whose resistivity is higher than the (later formed) phase change material layer 602. For example, the resistive layer 601 may be made of, for example, tantalum nitride (TaN), aluminum nitride (AlN), boron nitride (BN), aluminum oxide (AlO), tungsten nitride (WN), cobalt tungsten (CoW), nickel tungsten (NiW), yttrium oxide (YO), or alloys of these materials. Electrical resistance of the resistive layer 601 may be substantially greater than the resistance of the (later formed) phase change material layer 602 when the latter is in a low resistance state or crystalline state (e.g., ten to thirty or more times higher). On the other hand, electrical resistance of the resistive layer 601 may be substantially lower than the resistance of the (later formed) phase change material layer 602 when the latter is in a high resistance state or amorphous state (e.g., five to twenty or more times lower).

The resistive layer 601 may be deposited to have a thickness ranging from about a couple nanometers to about ten nanometers. According to one embodiment, the resistive layer 601 may be formed to improve electrical function, such as mitigating resistance drift, of the PCM device 10 during operation. Resistance drift refers to a phenomenon that resistance of the phase change material in a PCM device does not stay constant after being programmed, particularly after a RESET operation when the phase change material is set to an amorphous state. Instead, resistance of the phase change material changes as a function of time after being programmed. For example, the amorphous state of the phase change material layer 602 may exhibit a resistance drift over time and, when the resistive layer 601 is not present, the read current may pass through the amorphous state of the phase change material layer 602 that may have a changing electrical resistance that adversely affects the PCM device performance. The resistive layer 601, for example, may migrate this resistance drift. The resistance drift is mitigated by a resistive liner, such as the resistive layer 601, as the resistive liner shunts read current in the amorphous state of phase change material. With the resistive layer 601, in a process of the PCM device operation, the read current may pass through the resistive layer 601 onto a portion of the phase change material layer 602 that is in crystalline state and adjacent to the portion of the phase change material layer 602 that is in amorphous state. In other words, by passing through this resistive layer 601, the read current may bypass the switched region (in amorphous phase) of the phase change material layer 602. The resistive liner 601 mitigates likely resistance/conductance drift of the phase change material layer 602 of the (later formed) phase change elements 612 and 622 when the material of phase change elements 612 and 622 is in an amorphous state after a RESET operation.

Embodiments of present invention may also provide forming the phase change material layer 602 by forming a layer of, for example, germanium-antimony-tellurium (GST), gallium-antimony-tellurium (GaST), or silver-iridium-antimony-telluride (AlST) material, although other suitable materials may be used as well. Examples of other suitable phase change material may include, but not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. The phase change material layer 602 may be undoped or doped such as, e.g., doped with one or more of oxygen (O), nitrogen (N), silicon (Si), and Ti, and may be formed to have a thickness ranging, but not limited to, from about 20 nm to about 100 nm.

The dielectric layer 603 may be made of suitable dielectric material such as, for example, silicon nitride (SiN), boron nitride (SiB), silicon oxynitride (SiON), silicon boroncarbonitride (SiBCN), silicon oxycarbonitride (SiOCN), silicon carbonitride (SiCN), silicon oxycarbon (SiCO), or a combination thereof. The dielectric layer 603 may be formed to have a thickness ranging, but not limited to, from about 10 nm to about 30 nm.

In one embodiment, the resistive layer 601 may be a conformal resistor layer; the phase change material layer 602 may be a conformal phase change material layer; and the dielectric layer 603 may be a conformal dielectric layer. In another embodiment, the depth of the trench 521 may be deeper than a combined thickness of the resistive layer 601, the phase change material layer 602, and the dielectric layer 603 such that the trench 521 may not be fully filled. In other words, after the deposition of the dielectric layer 603, which may be a conformal dielectric layer, a gap may exist between the two vertical portions of the dielectric layer 603 below a top level of the ILD layer 511.

Figure 6:
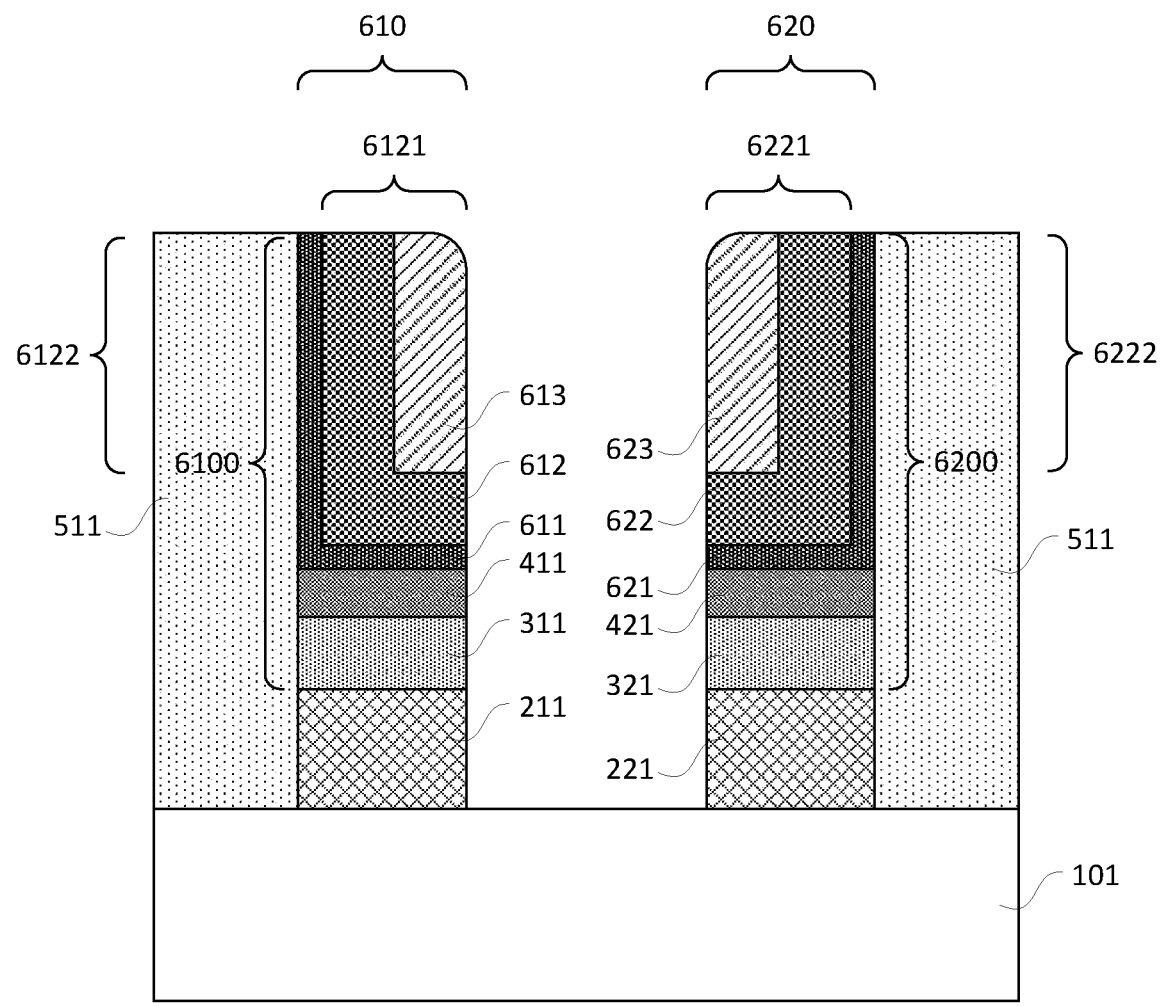
FIG. 6 is a demonstrative illustration of cross-sectional view of a PCM device in a step of manufacturing thereof, following the step illustrated in FIG. 5, according to one embodiment of present invention.

FIG. 6 is a demonstrative illustration of cross-sectional view of a PCM device in a step of manufacturing thereof, following the step illustrated in FIG. 5, according to one embodiment of present invention. More particularly, embodiments of present invention provide etching the conformal dielectric layer 603 into first and second sidewall spacers 613 and 623 by removing a horizontal portion of the conformal dielectric layer 603 between the two vertical portions thereof, in an anisotropic etching process. Embodiments of present invention provide using the first and second sidewall spacers 613 and 623 as etch masks in a subsequent etching process to etch the stack of layers, within the trench 521, that are above the supporting structure 101 and exposed by the removal of the horizontal portion of the conformal dielectric layer 603.

For example, embodiments of present invention provide applying an anisotropic etching process in etching the phase change material layer 602, the resistive layer 601, the interfacial layer 402, the selector layer 302, and the bottom electrode layer 202. The etching process may transform the phase change material layer 602, the resistive layer 601, the interfacial layer 402, the selector layer 302, and the bottom electrode layer 202 into first and second PCM cells 610 and 620. The first PCM cell 610 may include a first PCM stack 6100, a bottom electrode 211, and a top electrode 801 to be formed later (see FIG. 8). The first PCM stack 6100 may include the first sidewall spacer 613, an L-shaped phase change element 612, an L-shaped resistive liner 611, an interfacial layer 411, and a selector 311. The L-shaped phase change element 612 may include a horizontal portion 6121 and a vertical portion 6122 on top of the horizontal portion 6121 of the L-shaped phase change element 612. The first sidewall spacer 613 is directly adjacent to the vertical portion 6122 and on top of a portion of the horizontal portion 6121 of the L-shaped phase change element 612. The L-shaped resistive liner 611 conformally lines a sidewall and a bottom surface of the L-shaped phase change element 612. The interfacial layer 411 situates between the horizontal portion of the L-shaped resistive liner 611 and the selector 311.

Similarly, the etching process may form the second PCM cell 620 that includes a second PCM stack 6200, a bottom electrode 221, and a top electrode 801 to be formed later (see FIG. 8). The second PCM stack 6200 may include the second sidewall spacer 623, an L-shaped phase change element 622, an L-shaped resistive liner 621, an interfacial layer 421, and a selector 321. Similar to the L-shaped phase change element 612, the L-shaped phase change element 622 may have a horizontal portion 6221 and a vertical portion 6222 on top of the horizontal portion 6221 of the L-shaped phase change element 622. The second sidewall spacer 623 is directly adjacent to the vertical portion 6222 and on top of a portion of the horizontal portion 6221 of the L-shaped phase change element 622. The L-shaped resistive liner 621 conformally lines a sidewall and a bottom surface of the L-shaped phase change element 622. The interfacial layer 421 situates between the horizontal portion of the L-shaped resistive liner 621 and the selector 321.

The L-shaped phase change element 612 has the horizontal portion 6121 and the vertical portion 6122 on top of the horizontal portion 6121. A horizontal cross-sectional area of the vertical portion 6122 may be smaller than a surface area of the selector 311 that faces the bottom surface of the L-shaped phase change element 612, i.e., a bottom surface of the horizontal portion 6121 of the L-shaped phase change element 612. By the above structure, the selector 311 underneath the horizontal portion 6121 of the L-shaped phase change element 612 has a horizontal cross-sectional area that is much smaller than that of the vertical portion 6122 of the phase change element 612, resulting in a much lower current density than that in the vertical portion 6122 of the phase change element 612. Therefore, the selector 311 is able to avoid possible thermal damage during operation.

Similarly, the L-shaped phase change element 622 has the horizontal portion 6221 and the vertical portion 6222 on top of the horizontal portion 6221. A horizontal cross-sectional area of the vertical portion 6222 may be smaller than a surface area of the selector 321 that faces the bottom surface of the L-shaped phase change element 622, i.e., a bottom surface of the horizontal portion 6221 of the L-shaped phase change element 622. By the above structure, the selector 321 underneath the horizontal portion 6221 of the L-shaped phase change element 622 has a horizontal cross-sectional area that is much smaller than that of the vertical portion 6222 of the phase change element 622, resulting in a much lower current density than that in the vertical portion 6222 of the phase change element 622. Therefore, the selector 321 is able to avoid possible thermal damage during operation.

The vertical portion 6122 of the L-shaped phase change element 612 of the first PCM cell 610 and the vertical portion 6222 of the L-shaped phase change element 622 of the second PCM cell 620 are separated by the first sidewall spacer 613 and the second sidewall spacer 623, and a dielectric layer (to be formed) in-between as being described below in more details with reference to FIG. 7.

Figure 7:
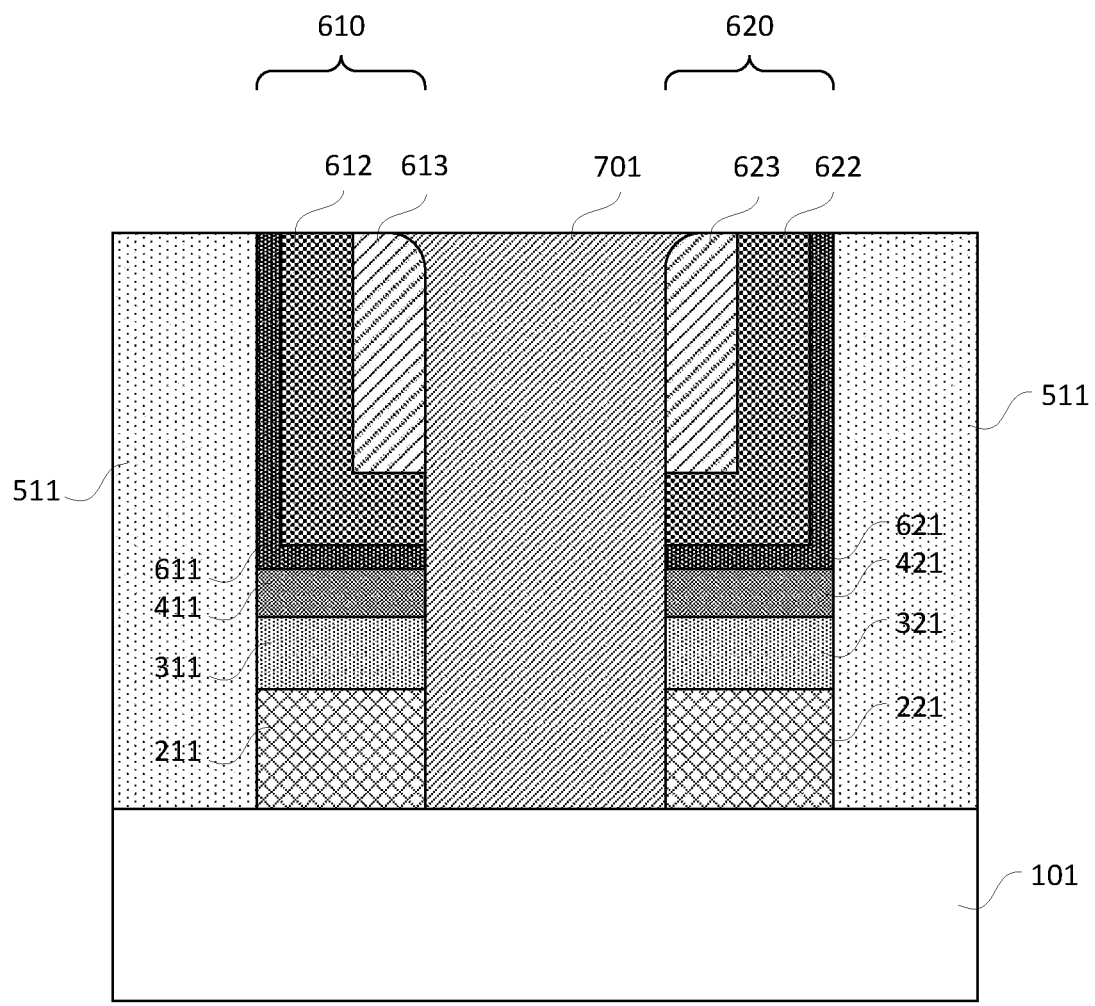
FIG. 7 is a demonstrative illustration of cross-sectional view of a PCM device in a step of manufacturing thereof, following the step illustrated in FIG. 6, according to one embodiment of present invention.

FIG. 7 is a demonstrative illustration of cross-sectional view of a PCM device in a step of manufacturing thereof, following the step illustrated in FIG. 6, according to one embodiment of present invention. More particularly, embodiments of present invention provide depositing a dielectric material to cover the top of the first and second PCM cells 610 and 620 and fill the gap between the first and second PCM cells 610 and 620. The deposition of the dielectric material may be followed by a CMP process to remove excessive portion of the dielectric material above the top surfaces of the first and second PCM stacks 6100 and 6200, thereby resulting a dielectric layer 701 with a top surface that is coplanar with the top surfaces of the first and second PCM stacks 6100 and 6200 and the ILD layer 511. The dielectric layer 701 may be made of, for example, SiN, SiO, or any other suitable dielectric materials.

Figure 8:
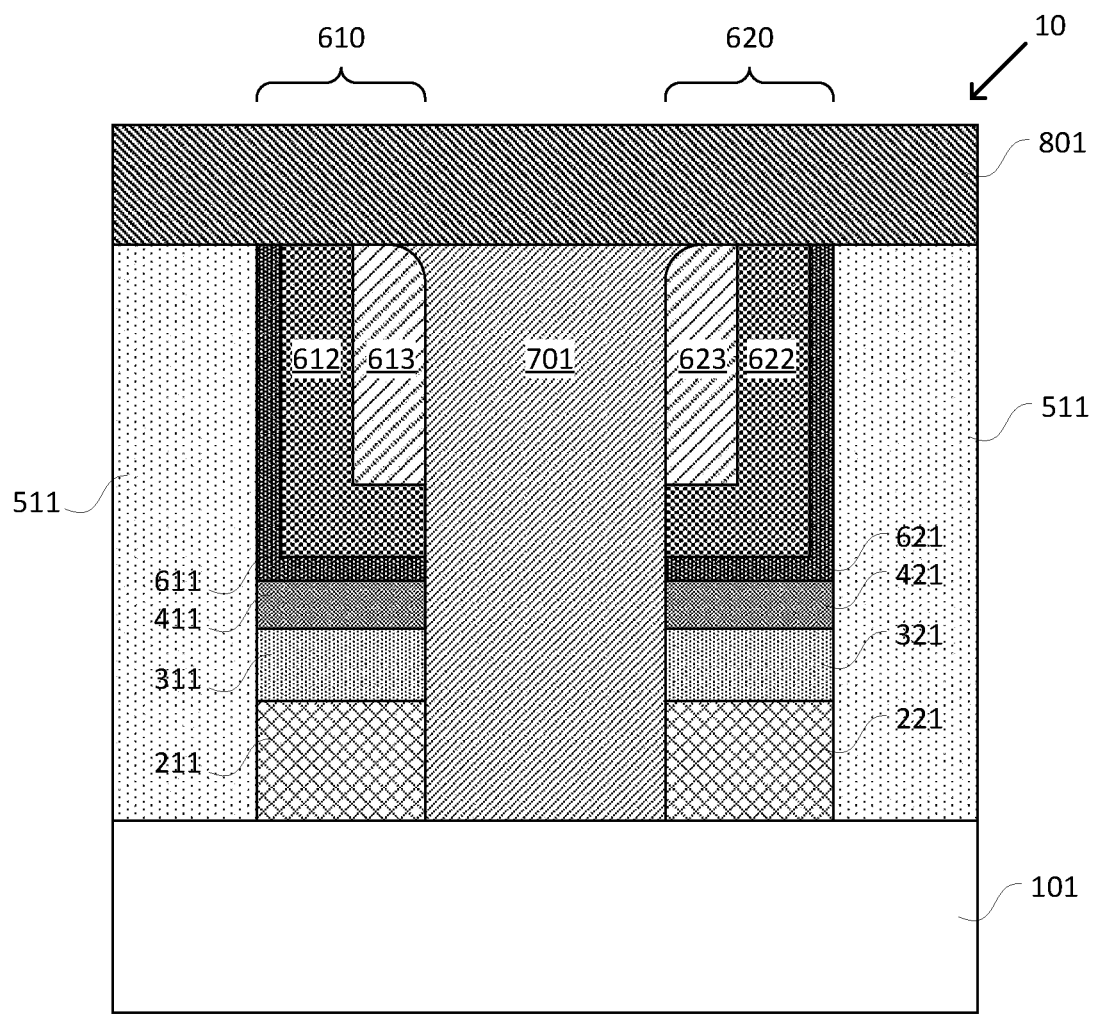
FIG. 8 is a demonstrative illustration of cross-sectional view of a PCM device in a step of manufacturing thereof, following the step illustrated in FIG. 7, according to one embodiment of present invention.

FIG. 8 is a demonstrative illustration of cross-sectional view of a PCM device in a step of manufacturing thereof, following the step illustrated in FIG. 7, according to one embodiment of present invention. More particularly, embodiments of present invention provide depositing a layer of conductive material on top of the first and second PCM stacks 6100 and 6200 such as, for example, on top of the vertical portions of the L-shaped phase change elements 612 and 622 and the first and second sidewall spacers 613 and 623. The layer of conductive material may also be formed on top of the dielectric layer 701 and the ILD layer 511. Embodiments of present invention provide patterning the conductive material layer into a top electrode 801, thereby forming the first PCM cell 610 and the second PCM cell 620. The top electrode 801 may be made of tungsten (W), copper (Cu), ruthenium (Ru), or other suitable conductive materials, and may be formed through a CVD process to have a thickness ranging from about 50 nm to about 100 nm. However, the thickness is not limited in this range and a thickness above or below this range is possible as well.

As being described above, the first PCM cell 610 may include the bottom electrode 211, the top electrode 801 and a first PCM stack 6100 that includes the selector 311, the interfacial layer 411, the L-shaped resistive liner 611, the L-shaped phase change element 612 and the first sidewall spacer 613. The second PCM cell 620 may include the bottom electrode 221, the top electrode 801 and a second PCM stack 6200 that includes the selector 321, the interfacial layer 421, the L-shaped resistive liner 621, the L-shaped phase change element 622 and the second sidewall spacer 623. In one embodiment, the first PCM cell 610 and the second PCM cell 620 may share a top electrode 801. The top electrode 801 may be formed or placed to be orthogonal to the bottom electrodes 211 and 221. As being demonstratively illustrated in FIG. 8, the top electrode 801 may extend from left to right, parallel to the paper, while the bottom electrodes 211 and 221 may extend into or out of the paper, therefore being orthogonal to the top electrode 801. In one embodiment, the top electrode 801 may be a metal level such as M3 or M4 and the bottom electrode 211 and 221 may be a metal level, one level below the M3 or M4 such as M2 or M3. In other words, the top and bottom electrodes may be two neighboring or adjacent metal levels in a back-end-of-line (BEOL) structure.

Figure 9:
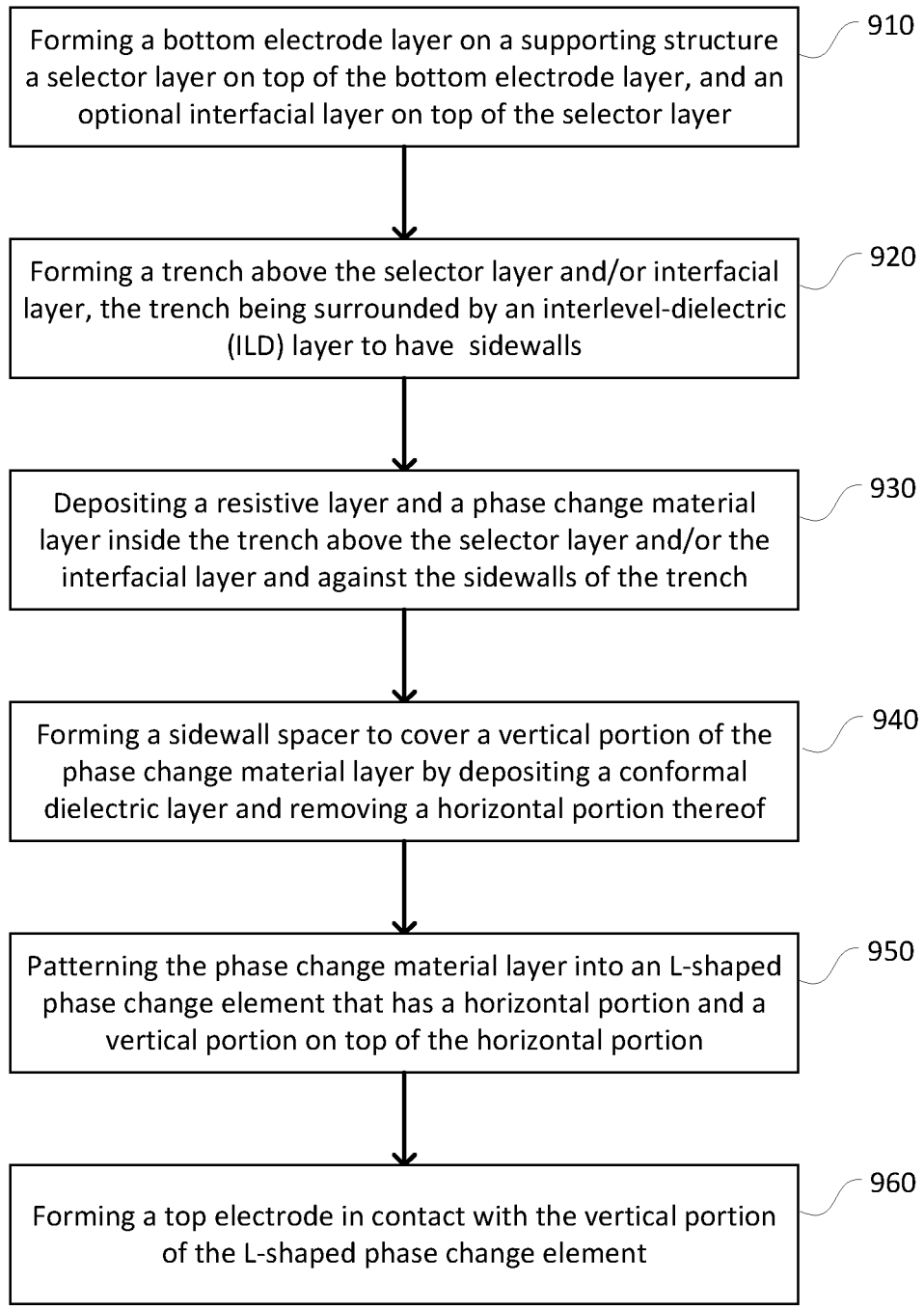
FIG. 9 is a demonstrative illustration of a flow-chart of a method of manufacturing a PCM device according to embodiments of present invention.

FIG. 9 is a demonstrative illustration of a flow-chart of a method of manufacturing a PCM device according to embodiments of present invention. The method includes (910) forming a bottom electrode layer on a supporting structure such as a substrate, forming a selector layer on top of the bottom electrode layer, and forming an optional interfacial layer on top of the selector layer; (920) forming a trench above the selector layer and/or the optional interfacial layer wherein the trench is surrounded by an interlevel dielectric layer to have sidewalls; (930) depositing a resistive layer and a phase change material layer inside the trench above the selector layer and/or the interfacial layer and against the sidewall of the trench; (940) forming a sidewall spacer to cover a vertical portion of the phase change material layer by for example, depositing a conformal dielectric layer on the phase change material layer and removing a horizontal portion in an anisotropic etching process to form the sidewall spacer; (950) patterning the phase change material layer into an L-shaped phase change element in an etching process using the sidewall spacer as an etch mask, wherein the L-shaped phase change element has a horizontal portion and a vertical portion on top of the horizontal portion; and (960) forming a top electrode in contact with the vertical portion of the L-shaped phase change element.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A phase change memory (PCM) device comprising:
    a first PCM cell, the first PCM cell comprising:
        an L-shaped phase change element, the L-shaped phase change element having a horizontal portion and a vertical portion on top of the horizontal portion;
        a selector underneath the horizontal portion of the L-shaped phase change element;
        a top electrode in contact with a top surface of the vertical portion of the L-shaped phase change element; and
        a bottom electrode in contact with the selector, and
    a second PCM cell,
    wherein the first PCM cell further comprises an L-shaped resistive liner, the L-shaped resistive liner conformally lining a sidewall and a bottom surface of the L-shaped phase change element.

2. The PCM device of claim 1, wherein the first PCM cell further comprises a sidewall spacer directly adjacent to the vertical portion of the L-shaped phase change element and on top of a portion of the horizontal portion of the L-shaped phase change element.

3. The PCM device of claim 2, wherein the second PCM cell comprises an L-shaped phase change element having a vertical portion and a horizontal portion, and a sidewall spacer directly adjacent to the vertical portion of the L-shaped phase change element of the second PCM cell, and wherein the vertical portions of the L-shaped phase change elements of the first and second PCM cells are separated by at least the sidewall spacers of the first and second PCM cells.

4. The PCM device of claim 3, wherein the second PCM cell shares the top electrode with the first PCM cell, and the top electrode is placed orthogonal to the bottom electrode.

5. The PCM device of claim 1, wherein the first PCM cell further comprises an interfacial layer between a horizontal portion of the L-shaped resistive liner and the selector.

6. The PCM device of claim 1, wherein the vertical portion of the L-shaped phase change element has a horizontal cross-sectional area that is smaller than a surface area of the selector that faces the horizontal portion of the L-shaped phase change element.

7. A phase change memory (PCM) device comprising:
    a PCM stack, the PCM stack comprising:
        an L-shaped phase change element having a horizontal portion and a vertical portion on top of the horizontal portion; and
        a selector underneath the horizontal portion of the L-shaped phase change element, a top electrode, the top electrode being in contact with the vertical portion of the L-shaped phase change element; and
    a bottom electrode underneath the selector,
    wherein the PCM stack further comprises a conformal L-shaped resistive liner, the conformal L-shaped resistive liner lining a sidewall and a bottom surface of the L-shaped phase change element.

8. The PCM device of claim 7, wherein the PCM stack further comprises a sidewall spacer, the sidewall spacer directly adjacent to the vertical portion and a portion of the horizontal portion of the L-shaped phase change element.

9. The PCM device of claim 8, wherein the PCM stack is a first PCM stack, further comprising a second PCM stack, the second PCM stack comprises:
    an L-shaped phase change element having a horizontal portion and a vertical portion; and
    a sidewall spacer directly adjacent to the vertical portion and a portion of the horizontal portion of the L-shaped phase change element of the second PCM stack,
    wherein the vertical portions of the L-shaped phase change elements of the first and second PCM stacks are separated at least by the sidewall spacers of the first and second PCM stacks.

10. The PCM device of claim 9, wherein the top electrode is in contact with the vertical portion of the L-shaped phase change element of the second PCM stack, and the top electrode is placed orthogonal to the bottom electrode.

11. The PCM device of claim 7, wherein the PCM stack further comprises an interfacial layer between a horizontal portion of the conformal L-shaped resistive liner and the selector.

12. The PCM device of claim 7, wherein the vertical portion of the L-shaped phase change element has a horizontal cross-sectional area that is smaller than a surface area of the selector that faces the horizontal portion of the L-shaped phase change element.

13. A method comprising:
forming a bottom electrode layer on a supporting structure;
forming a selector layer on top of the bottom electrode layer;
forming a trench above the selector layer, the trench being surrounded by an interlevel dielectric layer and having a sidewall;
depositing a resistive layer and a phase change material layer inside the trench and against the sidewall of the trench;
forming a sidewall spacer covering a vertical portion of the phase change material layer;
patterning the phase change material layer into an L-shaped phase change element, the L-shaped phase change element having a horizontal portion and a vertical portion on top of the horizontal portion; and
forming a top electrode in contact with the vertical portion of the L-shaped phase change element,
wherein patterning the phase change material layer further comprises patterning the selector layer into a selector and patterning the bottom electrode layer into a bottom electrode.

14. The method of claim 13, wherein patterning the phase change material layer further comprises patterning the resistive layer into an L-shaped resistive liner, the resistive liner conformally lining a sidewall and a bottom surface of the L-shaped phase change element.

15. The method of claim 13, wherein forming the top electrode comprises forming the top electrode to be orthogonal with the bottom electrode.

16. The method of claim 13, further comprising forming an interfacial layer above the selector layer before forming the trench.

17. The method of claim 16, wherein forming the trench comprises removing a hard mask from a top of the interfacial layer, wherein the hard mask is surrounded by the interlevel dielectric layer and is used in an etching process in forming the selector layer and the bottom electrode layer.

* * * * *